United States Patent [19]

Kim et al.

[11] Patent Number: 5,023,580
[45] Date of Patent: Jun. 11, 1991

[54] SURFACE-MOUNT FILTER

[75] Inventors: Jin D. Kim, Chicago; William T. Waldie, Palatine, both of Ill.

[73] Assignee: Motorola, Inc., Schaumburg, Ill.

[21] Appl. No.: 455,062

[22] Filed: Dec. 22, 1989

[51] Int. Cl.$^5$ .................... H01P 1/202; H04B 1/50
[52] U.S. Cl. .................... 333/206; 333/134; 333/202; 455/78
[58] Field of Search ............ 333/202, 204, 205, 206, 333/207, 134, 219, 219.1, 222; 455/78–83, 73; 361/399–401

[56] References Cited

U.S. PATENT DOCUMENTS

| | | | |
|---|---|---|---|
| 4,431,977 | 2/1984 | Sokola et al. | 333/206 |
| 4,464,640 | 8/1984 | Nishikawa et al. | 333/202 |
| 4,673,902 | 6/1987 | Takeda et al. | 333/202 |
| 4,703,291 | 10/1987 | Nishikawa et al. | 333/202 |
| 4,713,633 | 12/1987 | Saito et al. | 333/206 X |
| 4,716,391 | 12/1987 | Moutrie et al. | 333/202 X |
| 4,742,562 | 5/1988 | Kommrusch | 333/202 X |
| 4,745,379 | 5/1988 | West et al. | 333/206 |
| 4,758,808 | 7/1988 | Sasaki et al. | 333/185 |

Primary Examiner—Eugene R. Laroche
Assistant Examiner—Seung Ham
Attorney, Agent, or Firm—Rolland R. Hackbart

[57] ABSTRACT

A filter assembly (100) includes a ceramic block filter (102) and shielding bracket (132) which surface mounts to a printed circuit board (152) for interconnecting to radio frequency devices, such as a radio transceiver. The bracket (132) is soldered to the filter (102) and includes two openings (136 and 137) for exposing input-/output electrodes (106 and 107) of the filter. The printed circuit board (152) includes an opening (162) shaped to accept the filter (102) and bracket (132) when inserted therein. Transmission lines (156 and 157) are disposed on tabs (158 and 159) and are reflow soldered to the corresponding electrodes (106 and 107) of the filter. The bracket (132) includes two tabs (134) which are reflow soldered to grounded portions of the circuitry on the top side of the printed circuit board (152).

24 Claims, 1 Drawing Sheet

SURFACE-MOUNT FILTER

BACKGROUND OF THE INVENTION

The present invention relates generally to radio frequency (RF) signal filters, and more particularly to a surface-mount filter that couples the printed circuit boards of radio transceivers.

Interconnection to prior art ceramic block filters may be accomplished by integral conventional coupling connectors as shown and described in U.S. Pat. No. 4,431,977 or by integral coaxial coupling cables retained by a housing as shown and described in U.S. Pat. No. 4,742,562. However, in both of the foregoing instances coaxial cables are required for interconnection, thereby incurring additional cost.

The need for coaxial cables may be eliminated by surface mounting the filter and coupling to the resonators thereof by direct solder connection as shown and described in U.S. Pat. No. 4,673,902. However, direct solder connections to the ceramic block are not reliable since small protrusions i the circuit board may result in open connections. Alternatively, wires may be connected to the resonators as shown and described in U.S. Pat. No. 4,703,291 or to input/output pads as shown and described in U.S. Pat. No. 4,716,391. However, the use of individual wires likewise both increases the manufacturing cost and is unreliable. Therefore, there is need for a surface-mount filter that reliably and inexpensively surface mounts to printed circuit boards of radio transceivers.

OBJECTS OF THE INVENTION

Accordingly, it is an object of the present invention to provide an improved dielectric block filter that reliably and inexpensively surface mounts to printed circuit boards of RF devices.

It is another object of the present invention to provide an improved dielectric block filter with shielding bracket, that reliably and inexpensively surface mount to printed circuit boards of RF devices.

DETAILED DESCRIPTION OF THE PREFERRED EMBODIMENT

Figure 1:
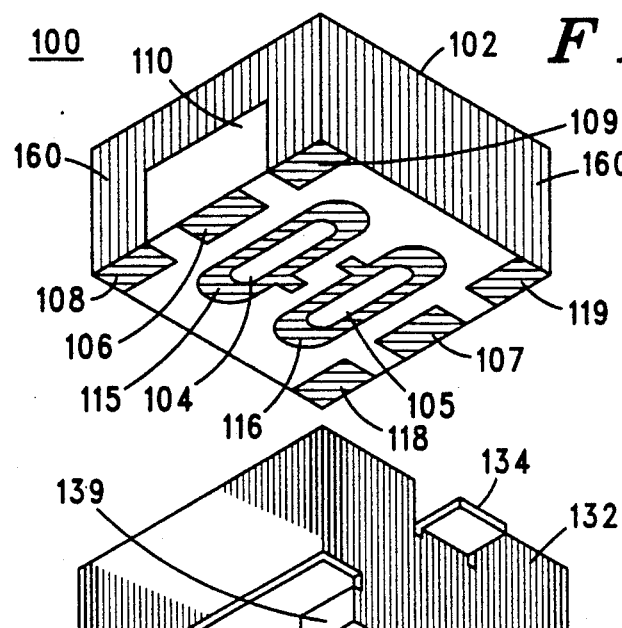
FIG. 1 is an exploded perspective view of a ceramic block filter, shielding bracket, and printed circuit board, embodying the present invention.
Figure 3:
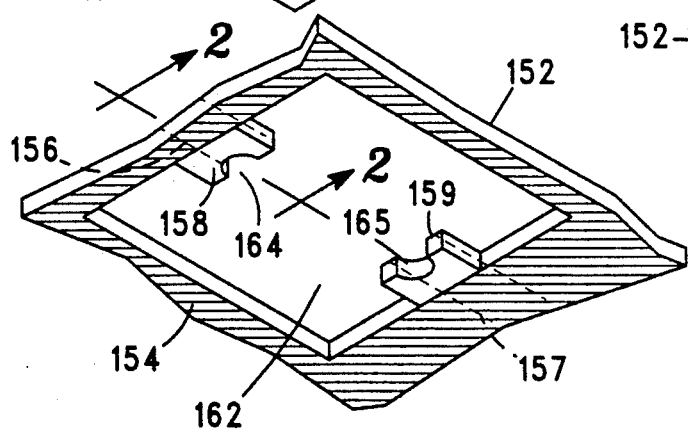
FIG. 3 is a block diagram of a radio transceiver including shielded ceramic block filters of the present invention for coupling the transmitter and receiver thereof to a common antenna.
Figure 3:
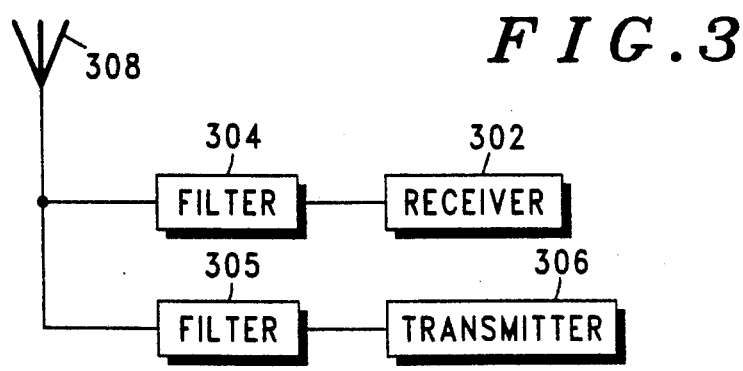

Referring to FIG. 1, there is illustrated an exploded perspective view of a filter assembly 100 including ceramic block filter 102, shielding bracket 132, and printed circuit board 152, and embodying the present invention. Filter 102 is a dielectric block filter preferably comprised of a high-dielectric low-loss ceramic, such as those ceramics described in U.S. Pat. Nos. 3,938,064 and 4,431,977. Filter 102 includes electrodes 106 and 107 for interconnection to radio frequency (RF) circuitry of a conventional radio transceiver, such as the transceiver shown and described in Motorola instruction manual number 68P81070E40, entitled "DYNATAC Cellular Mobile Telephone," published by and available from Motorola C & E Parts, 1313 East Algonquin Road, Schaumburg, Ill. 60196. As illustrated in FIG. 3, shielded ceramic block filters 304 and 305 of the present invention may couple RF receiver 302 and RF transmitter 306, respectively, to a common antenna 308 of a radio transceiver.

Filter 102 includes two holes 104 and 105 extending from the top surface to the bottom surface thereof. Although filter 102 is shown having two holes 104 and 105, any number of one or more holes may be used in filters embodying the present invention. The bottom and sides of filter 102 and internal surfaces of holes 104 and 105 are covered with conductive material 160 over substantially their entire surfaces, with the exception of area 110 and a corresponding area on the side opposite to area 110. The top surface of filter 102 may be covered by portions of conductive material 108, 109, 118 and 119 near the periphery thereof, which are electrically connected to the conductive material on the side surfaces of filter 102. Also disposed on the top surface of filter 102 are electrodes 106 and 107 and electrodes 115 and 116. Electrodes 115 and 116 are comprised of conductive material and electrically connected to the conductive material of holes 104 and 105, respectively. Electrodes 106 and 107 are likewise comprised of conductive material.

Holes 104 and 105 form transmission line resonators which may be turned by removing conductive material from electrodes 115 and 116, respectively, or from the surrounding conductive material 108, 109, 118, 119 and 160. Holes 104 and 105 have a substantially circular cross section, although other shapes may be used, such as, for example, a rectangular cross section with rounded corners and parallel elongated sides. The electrodes 115 and 116 for holes 104 and 105 may have varying shapes for capacitively coupling to the surrounding conductive material 108, 109, 118, 119 and 160. The amount of capacitive coupling between electrodes 115 and 116 and the surrounding conductive material 108, 109, 118, 119 and 160 ca be varied by decreasing or increasing the gap between electrodes 115 and 116 and the surrounding conductive material 108, 109, 118, 119 and 160, by varying the size of electrodes 115 and 116, or by any other suitable means. Each of the holes 104 and 105 functions essentially as a foreshortened transmission line resonator. In the preferred embodiment, the conductive material covering the surfaces of filter 102 is comprised of silver.

Shielding bracket 132 is preferably comprised of a conductive metal (or metallized plastic in other applications) and is shaped to accept filter 102 when inserted therein. The sides of bracket 132 extend at least partially over the corresponding sides of filter 102. Filter 102 may be attached to bracket 132 by means of solder or any other suitable adhesive. Bracket 132 electromagnetically shielding filter 102 from other circuitry. Bracket 132 substantially enclosed the top surface of filter 102 for includes tab 134 and a corresponding tab on the side opposite to tab 134, both of which contact the top side of printed circuit board 152 for positioning bracket 132 and filter 102. Bracket 132 also includes openings 136 and 137 for exposing electrodes 106 and 107 of filter 102. Portions 138 and 139 of bracket 132 extend into opening 136 (and corresponding portions of bracket 132 extend into opening 137) for contacting conductive portions 108 and 109, respectively, of filter 102 for positioning filter 102 in bracket 132. Portions 138 and 139 of bracket 132 (and corresponding portions of bracket 132 extend into opening 137 and position filter 102 relative to tab 134 (and a corresponding tab on the side opposite to tab 134) by an amount approximately equal to the thickness of printed circuit board 152.

Figure 4:
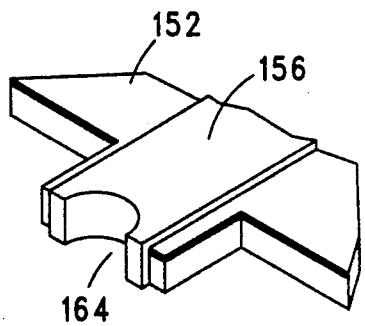
FIG. 4 is a partial top view of printed circuit board 152 in FIG. 1.

Printed circuit board 152 includes an opening 162 that is shaped to accept fitler 102 and bracket 132 when inserted therein. Printed circuit board 152 includes transmission lines 156 and 157 which contact and couple electrodes 106 and 107, respectively, of filter 102 to other RF circuitry thereon. According to the present invention, filter 102 and bracket 132 may be surface mounted in hole 162 of printed circuit board 152 and bonded thereto during reflow soldering of printed circuit board 152 and the other components thereon. Transmission lines 156 and 157 are disposed on tabs 158 and 159, respectively, extending into hole 162. Transmission line 156 is shown more clearly in the partial top view of printed circuit board 152 in FIG. 4. Tabs 158 and 159 may vary in width and, in other embodiments, may extend across the entire edge of hole 162. Printed circuit board 152 has a ground plane 154 on its bottom side except for portions near transmission lines 156 and 157. Tab 134 of bracket 132 and a corresponding tab on the side opposite to tab 134 contact and are reflow soldered to grounded portions of circuitry on the top side of printed circuit board 152.

According to the present invention, electrodes 106 and 107 of filter 102 are bonded directly to transmission lines 156 and 157 on tabs 158 and 159, respectively, of printed circuit board 152. Since tab 134 of bracket 132 and a corresponding tab on the side opposite to tab 134 support filter 102 in the middle, open circuit connections are avoided between electrode 106 and transmission line 156, and between electrode 107 and transmission line 157. Therefore, by utilizing the present invention, filter 102 and bracket 132 may be reliably and inexpensively surface mounted to printed circuit boards of RF devices. Although shown with two electrodes 106 and 107 and two transmission lines 156 and 157, only one electrode and one transmission line need be used in practicing the present invention.

Figure 2:
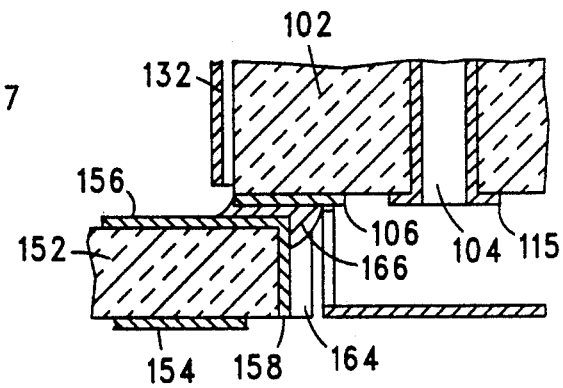
FIG. 2 is a cross sectional view of the printed circuit board in FIG. 1 taken along lines 2—2.

Referring next to FIG. 2, there is illustrated a partial cross sectional view of filter 102, bracket 132, and printed circuit board 152 in FIG. 1 taken through tabs 158 and 159 and transmission lines 156 and 157 along lines 2—2. Ground plane 154 on the bottom of printed circuit board 152 does not extend out under tabs 158 and 159. Tabs 158 and 159 include semicircular plated through holes 164 and 165 disposed at the periphery or edges of tabs 158 and 159. Holes 164 and 165 may also be circular in shape and disposed away from the edges at the ends of tabs 158 and 159, respectively. Holes 164 and 165 extend through transmission lines 156 and 157, respectively, so that the reflow of solder between transmission lines 156 and 157 and electrodes 106 and 107, respectively, of filter 102 may be enhanced and visually inspected. A solder fillet 166 is formed between hole 164 and electrode 106 (and also between hole 165 and electrode 107) when filter 102 has been properly reflow soldered. Therefore, the proper soldering of filter 102 may be determined simply by visually inspecting filter assembly 100 for solder fillet 166.

In summary, a unique shielded dielectric block filter reliably and inexpensively surface mounts to printed circuit boards of RF devices, such as radio transceivers. The unique dielectric block filter of the present invention may be advantageously utilized in any application where surface-mount RF filters are desired.

We claim:

1. A filter assembly, comprising:
    surface-mount filtering means, comprising:
        a dielectric block having top, bottom and side surfaces and having at least a first hole extending from the top surface toward the bottom surface, said bottom and side surfaces and said hole being substantially covered with a conductive material;
        first electrode means disposed on the top surface of said dielectric block for capacitively coupling to said first hole;
        bracket means for substantially enclosing the top surface of said dielectric block, said bracket means further having a first opening opposite to and exposing said first electrode means; and
    circuit board means including;
        an opening having a first tab for receiving said surface-mount filtering means; and
        first coupling means disposed on said first tab for coupling to said first electrode means of said surfacemount filtering means.

2. The filter assembly of claim 1, wherein said bracket means includes at least one tab extending therefrom for engaging said circuit board means.

3. The filter assembly of claim 1, wherein said first coupling means includes first transmission line means.

4. The filter assembly of claim 3, wherein the first tab of said circuit board means includes a first plated through hole coupled to said first transmission line means.

5. The filter assembly of claim 4, wherein said first plated through hole has a semicircular cross section and is disposed at the periphery of said first tab.

6. The filter assembly of claim 1, further comprising:
    said surface-mount filtering means further including:
        said dielectric block further including a second hole extending from the top surface toward the bottom surface and being substantially covered with the conductive material; and
        second electrode means disposed on the top surface of said dielectric block for capacitively coupling to said second hole;
    said bracket means further including a second opening opposite to and exposing said second electrode means; and
    said circuit board means further including a second a second tab for receiving said surface-mount filtering means, and second coupling means disposed on said second tab for coupling to said second electrode means of said surface-mount filtering means.

7. The filter assembly of claim 6, wherein said bracket means includes at least one tab extending therefrom for engaging said circuit board means.

8. The filter assembly of claim 6, wherein said first and second coupling means include first and second transmission line means, respectively.

9. The filter assembly of claim 8, wherein the first and second tabs of said circuit board means include first and second plated through holes coupled to said first and second transmission line means, respectively.

10. The filter assembly of claim 9, wherein said first and second plated through holes each have a semicircular cross section and are disposed at the periphery of said first and second tabs, respectively.

11. A surface-mount filter for attaching to circuit board means including an opening having a first tab for receiving said surface-mount filter and first coupling means disposed on the first tab, said surface-mount fitler comprising:
   a dielectric block having top, bottom and side surfaces and having at least a first hole each extending from the top surface toward the bottom surface, said bottom and side surfaces and said holes being substantially covered with a conductive material;
   first electrode means disposed on the top surface of said dielectric block for capacitively coupling to said first hole; and
   bracket means for attaching to and substantially enclosing the top surface of said dielectric block, said bracket means further having a first opening opposite to and exposing said first electrode means, whereby said first electrode means is coupled to said first coupling means.

12. The surface-mount filter of claim 11, wherein said bracket means includes at least one tab extending therefrom for engaging said circuit board means.

13. The surface-mount filter of claim 11, wherein said circuit board means further includes a second tab for receiving said surface-mount filter and second coupling means disposed on the second tab, said surface-mount filter further comprising:
   said dielectric block further including a second hole extending from the top surface toward the bottom surface and being substantially covered with the conductive material;
   second electrode means disposed on the top surface of said dielectric block for capacitively coupling to said second hole; and
   said bracket means further including a second opening opposite to and exposing said second electrode means, whereby said second electrode means is coupled to said second coupling means.

14. The surface-mount filter of claim 13, wherein said bracket means includes at least one tab extending therefrom for engaging said circuit board means.

15. A radio transceiver comprising:
   an antenna;
   a transmitter having an output;
   surface-mount filtering means for coupling said transmitter to said antenna, comprising:
      a dielectric block having top, bottom and side surfaces and having at least two holes each extending from the top surface toward the bottom surface, said bottom and side surfaces and said hole being substantially covered with a conductive material;
      first electrode means coupled to the output of said transmitter and disposed on the top surface of said dielectric block for capacitively coupling to said first hole;
      second electrode means coupled to said antenna and disposed on the top surface of said dielectric block for capacitively coupling to said second hole; and
      bracket means for attaching to and substantially enclosing the top surface of said dielectric block, said bracket means further having first and second openings opposite to and exposing said first and second electrode means, respectively, and said first and second electrode means attaching to said first and second tabs, respectively; and
   circuit board means including;
      an opening having first and second tabs for receiving said surface-mount filtering means; and
      first and second coupling means disposed on said first and second tabs, respectively, for coupling said first and second electrodes of said surface-mount filtering means to the output of said transmitter and said antenna, respectively.

16. The radio transceiver of claim 15, wherein said bracket means includes at least one tab extending therefrom for engaging said circuit board means.

17. The radio transceiver of claim 15, wherein said first and second coupling means include first and second transmission line means, respectively.

18. The radio transceiver of claim 17, wherein the first and second tabs of said circuit board means include first and second plated through holes coupled to said first and second transmission line means, respectively.

19. The radio transceiver of claim 18, wherein said first and second plated through holes each have a semicircular cross section and are disposed at the periphery of said first and second tabs, respectively.

20. A radio transceiver comprising:
   an antenna;
   a receiver having an input;
   surface-mount filtering means for coupling said receiver to said antenna, comprising:
      a dielectric block having top, bottom and side surfaces and having at least two holes each extending from the top surface toward the bottom surface, said bottom and side surfaces and said holes being substantially covered with a conductive material;
      first electrode means coupled to the input of said receiver and disposed on the top surface of said dielectric block for capacitively coupling to said first hole;
      second electrode means coupled to said antenna and disposed on the top surface of said dielectric block for capacitively coupling to said second hole; and
      bracket means for attaching to and substantially enclosing the top surface of said dielectric block, said bracket means further having first and second openings opposite to and exposing said first and second electrode means, respectively, and said first and second electrode means attaching to said first and second tabs, respectively; and
   circuit board means including;
      an opening having first and second tabs for receiving said surface-mount filtering means; and
      first and second coupling means disposed on said first and second tabs, respectively, for coupling said first and second electrodes of said surface-mount filtering means to the input of said receiver and sand antenna, respectively.

21. The radio transceiver of claim 20, wherein said bracket means includes at least one tab extending therefrom for engaging said circuit board means.

22. The radio transceiver of claim 20, wherein said first and second coupling means include first and second transmission line means, respectively.

23. The radio transceiver 22, wherein the first and second tabs of said circuit board means include first and second plated through holes coupled to said first and second transmission line means, respectively.

24. The radio transceiver 23, wherein said first and second plated through holes each have a semicircular cross section and are disposed at the periphery of said first and second tabs, respectively.

* * * * *